(12) United States Patent
Bolken et al.

(10) Patent No.: US 7,227,252 B2
(45) Date of Patent: Jun. 5, 2007

(54) SEMICONDUCTOR COMPONENT HAVING STACKED, ENCAPSULATED DICE AND METHOD OF FABRICATION

(75) Inventors: Todd O. Bolken, Meridian, ID (US); Chad A. Cobbley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/205,572

(22) Filed: Aug. 17, 2005

(65) Prior Publication Data

US 2006/0006518 A1 Jan. 12, 2006

Related U.S. Application Data

(62) Division of application No. 10/862,102, filed on Jun. 4, 2004, now Pat. No. 7,109,576, which is a division of application No. 10/436,584, filed on May 12, 2003, now Pat. No. 6,853,064.

(51) Int. Cl.
| | |
|---|---|
| H01L 23/48 | (2006.01) |
| H01L 23/31 | (2006.01) |
| H01L 23/02 | (2006.01) |
| H01L 23/40 | (2006.01) |
| H01L 23/34 | (2006.01) |

(52) U.S. Cl. .............. 257/686; 257/E25.031; 257/E23.042; 257/E23.126; 257/E25.011; 257/E25.023; 257/E25.013; 257/777; 257/723; 257/685; 257/784; 257/786; 257/789; 257/788; 257/790; 257/724

(58) Field of Classification Search ........ 257/E23.126, 257/E35.011, E25.031, E23.042, E25.013, 257/E25.023, 686, 685, 723, 724, 777, 734, 257/786–790, 784

See application file for complete search history.

(56) References Cited

U.S. PATENT DOCUMENTS

| | | | |
|---|---|---|---|
| 5,384,480 | A | 1/1995 | Naka et al. |
| 5,784,261 | A | 7/1998 | Pedder |
| 5,973,396 | A | 10/1999 | Farnworth |
| 6,013,948 | A | 1/2000 | Akram et al. |
| 6,020,629 | A | 2/2000 | Farnworth et al. |
| 6,051,886 | A | 4/2000 | Fogal et al. |
| 6,235,554 | B1 | 5/2001 | Akram et al. |
| 6,303,981 | B1 | 10/2001 | Moden |
| 6,316,840 | B1 | 11/2001 | Otani |
| 6,331,453 | B1 | 12/2001 | Bolken et al. |
| 6,339,255 | B1 | 1/2002 | Shin |
| 6,368,896 | B2 | 4/2002 | Farnworth et al. |
| 6,399,416 | B1 | 6/2002 | Wark |

(Continued)

FOREIGN PATENT DOCUMENTS

EP 0736903 A2 * 10/1996

Primary Examiner—Alexander Oscar Williams
(74) Attorney, Agent, or Firm—Stephen A. Gratton

(57) ABSTRACT

A semiconductor component includes a substrate and multiple stacked, encapsulated semiconductor dice on the substrate. A first die is back bonded to the substrate and encapsulated in a first encapsulant, and a second die is back bonded to the first encapsulant. The first encapsulant has a planar surface for attaching the second die, and can also include locking features for the second die. The component also includes a second encapsulant encapsulating the second die and forming a protective body for the component. A method for fabricating the component includes the steps of attaching the first die to the substrate, forming the first encapsulant on the first die, attaching the second die to the first encapsulant, and forming the second encapsulant on the second die.

9 Claims, 6 Drawing Sheets

U.S. PATENT DOCUMENTS

| | | |
|---|---|---|
| 6,407,456 B1 | 6/2002 | Ball |
| 6,451,624 B1 | 9/2002 | Farnworth et al. |
| 6,458,625 B2 | 10/2002 | Akram |
| 6,489,678 B1 | 12/2002 | Joshi |
| 6,501,165 B1 | 12/2002 | Farnworth et al. |
| 6,506,625 B1 | 1/2003 | Moden |
| 6,507,114 B2 | 1/2003 | Hui et al. |
| 6,518,186 B1 | 2/2003 | Wensel |
| 6,531,338 B2 | 3/2003 | Akram et al. |
| 6,531,763 B1 | 3/2003 | Bolken et al. |
| 6,531,766 B1 | 3/2003 | Taniguchi et al. |
| 6,541,871 B2 | 4/2003 | Pai et al. |
| 6,543,512 B1 | 4/2003 | Hamren |
| 6,552,910 B1 | 4/2003 | Moon et al. |
| 6,560,117 B2 | 5/2003 | Moon |
| 6,569,709 B2 | 5/2003 | Derderian |
| 6,570,249 B1 | 5/2003 | Liao et al. |
| 6,579,399 B1 | 6/2003 | Hamren |
| 6,582,992 B2 | 6/2003 | Poo et al. |
| 6,607,937 B1 | 8/2003 | Corisis |
| 6,611,052 B2 | 8/2003 | Poo et al. |
| 6,614,104 B2 | 9/2003 | Farnworth et al. |
| 6,621,172 B2 | 9/2003 | Nakayama et al. |
| 6,706,557 B2 | 3/2004 | Koopmans |
| 6,731,010 B2 | 5/2004 | Horiuchi et al. |
| 6,740,546 B2 | 5/2004 | Corisis et al. |
| 6,767,767 B2 | 7/2004 | Hayashida et al. |
| 6,774,471 B2 | 8/2004 | Chee |
| 6,781,222 B2 | 8/2004 | Wu et al. |
| 6,781,240 B2 * | 8/2004 | Choi ................. 257/777 |
| 6,815,746 B2 | 11/2004 | Suzuki et al. |
| 6,853,064 B2 | 2/2005 | Bolken et al. |
| 6,861,288 B2 | 3/2005 | Shim et al. |
| 6,906,408 B2 | 6/2005 | Cloud et al. |
| 6,992,396 B2 * | 1/2006 | Arai et al. ............. 257/777 |
| 7,008,822 B2 | 3/2006 | Bolken et al. |
| 7,091,623 B2 * | 8/2006 | Tsai et al. ............. 257/783 |
| 7,109,576 B2 | 9/2006 | Bolken et al. |
| 2002/0079567 A1 | 6/2002 | Lo et al. |
| 2002/0140085 A1 | 10/2002 | Lee et al. |
| 2002/0175401 A1 | 11/2002 | Huang et al. |
| 2003/0011067 A1 | 1/2003 | Kimura |
| 2003/0042615 A1 | 3/2003 | Jiang et al. |
| 2003/0127719 A1 | 7/2003 | Chang |
| 2003/0160311 A1 | 8/2003 | Ismall et al. |
| 2004/0082100 A1 | 4/2004 | Tsukahara et al. |
| 2004/0106230 A1 | 6/2004 | Chan et al. |
| 2004/0135242 A1 * | 7/2004 | Hsin ................. 257/686 |
| 2004/0164390 A1 | 8/2004 | Wang |
| 2004/0188818 A1 | 9/2004 | Wang |
| 2004/0195667 A1 | 10/2004 | Kamezos |
| 2004/0262734 A1 * | 12/2004 | Yoo ................. 257/686 |
| 2005/0064631 A1 | 3/2005 | Tsai et al. |
| 2006/0043559 A1 | 3/2006 | Chow et al. |

* cited by examiner

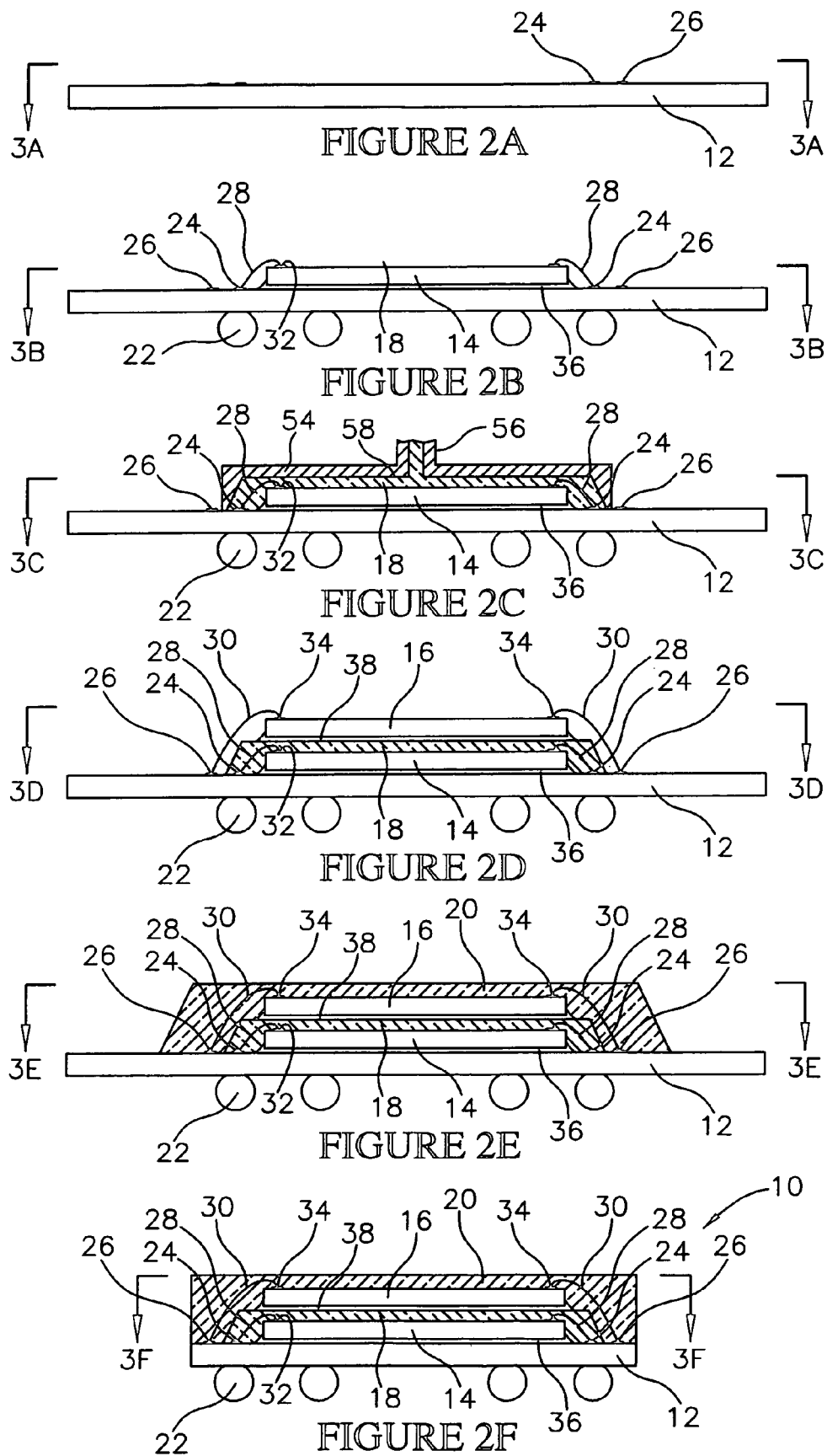

SEMICONDUCTOR COMPONENT HAVING STACKED, ENCAPSULATED DICE AND METHOD OF FABRICATION

CROSS REFERENCE TO RELATED APPLICATIONS

This application is a division of Ser. No. 10/862,102 filed Jun. 4, 2004, U.S. Pat. No. 7,109,576, which is a division of Ser. No. 10/436,584 filed May 12, 2003, U.S. Pat. No. 6,853,064 B2.

This application is related to Ser. No. 10/649,147 filed Aug. 27, 2003, U.S. Pat. No. 7,008,822.

FIELD OF THE INVENTION

This invention relates generally to semiconductor manufacture and packaging. More particularly, this invention relates to a stacked dice semiconductor component, to a method for fabricating the component, and to systems incorporating the component.

BACKGROUND OF THE INVENTION

Semiconductor manufacturers have developed components, such as packages and BGA devices, which contain multiple semiconductor dice. For example, systems in a package (SIP) include multiple dice having different configurations, such as a memory, a processing, or an application specific configuration. The multiple dice provide increased integration, security and performance in a component.

Semiconductor manufacturers have also developed components such as chip scale packages, having a smaller outline and a higher input/output capability than conventional components. Chip scale components have a peripheral outline (footprint) that is about the same as that of the dice contained in the components. It would be advantageous for a semiconductor component to have multiple semiconductor dice but with a chip scale outline.

One aspect of chip scale components, is that they are difficult to manufacture with the reliability required in the industry. For example, some chip scale components include relatively complicated signal transmission systems, which are difficult to manufacture, and prone to failure. It would be advantageous for a multi-dice chip scale component to have a reliable signal transmission system capable of volume manufacture.

The present invention is directed to a semiconductor component having multiple dice, a chip scale outline, and a reliable signal transmission system. In addition, the present invention is directed to a method for fabricating the component which uses conventional equipment, and produces a reliable component. The present invention is also directed to systems incorporating one or more of the components.

SUMMARY OF THE INVENTION

In accordance with the present invention, a semiconductor component having stacked, encapsulated dice, a method for fabricating the component, and systems incorporating the component are provided.

The component includes a substrate having terminal contacts on an outer surface, and interconnect contacts on an inner surface in electrical communication with the terminal contacts. The component also includes a first semiconductor die back bonded to the inner surface of the substrate, a first encapsulant on the first die, and a second semiconductor die back bonded to the first encapsulant. The first encapsulant has a planar surface for attaching the second die, and can also include locking features for implementing attachment of the second die. The component also includes an internal signal transmission system, which comprises a plurality of interconnects bonded to the interconnect contacts on the substrate and to die contacts on the circuits sides of the dice. In addition, the component includes a second encapsulant encapsulating the second die, the first encapsulant and the interconnects.

An alternate embodiment component includes three or more stacked, encapsulated dice on a substrate. Another alternate embodiment component includes multiple stacks of stacked, encapsulated dice. Another alternate embodiment component includes a stack of dice having at least two first dice back bonded to the substrate, and a second die stacked on and substantially covering the first dice.

A method for fabricating the component includes the steps of providing the substrate, attaching the first die to the substrate, forming first interconnects between the first die and the substrate, and forming the first encapsulant on the first die and on the first interconnects. The method also includes the steps of attaching the second die to the first encapsulant, forming second interconnects between the second die and the substrate, and forming the second encapsulant on the second die, on the second interconnects and on the first encapsulant.

The component can be used to construct various electrical systems such as computer systems, camcorder systems, camera systems, cellular telephone systems, and medical device systems.

BRIEF DESCRIPTION OF THE DRAWINGS

FIGS. 2A-2F are enlarged schematic cross sectional views illustrating steps in a method for fabricating the component;

Figures 1A, 1B:
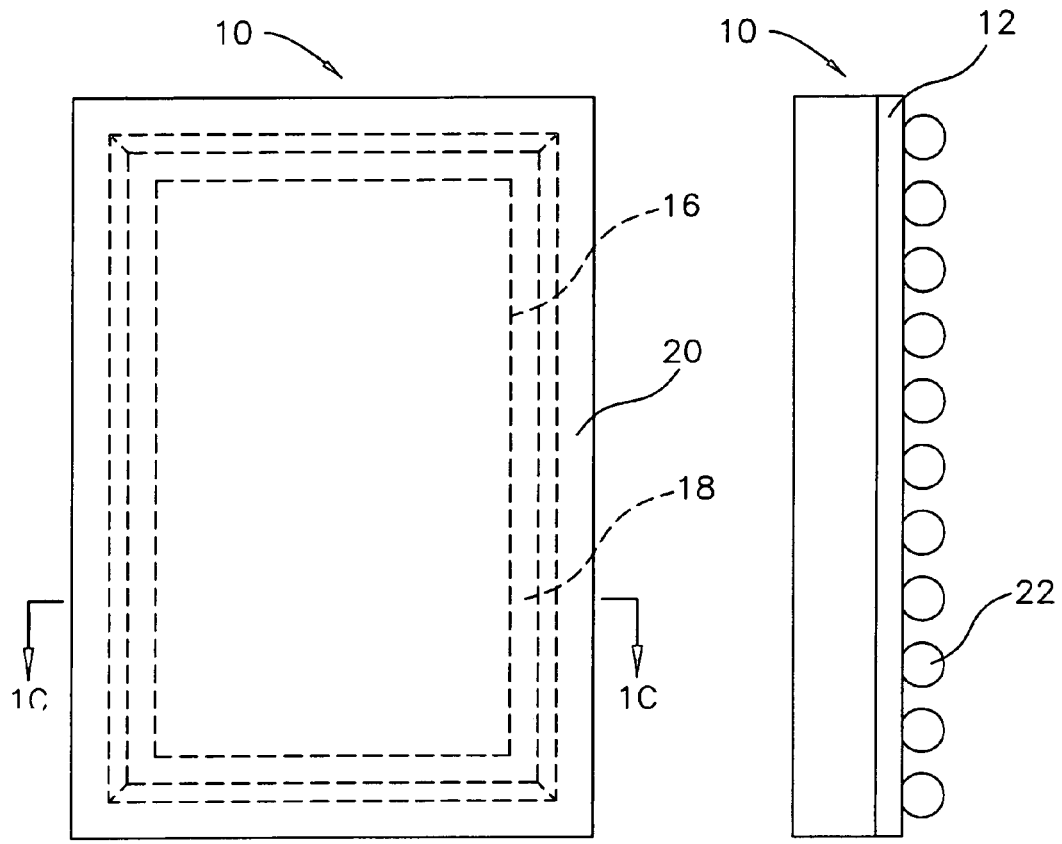
FIG. 1A is an enlarged schematic plan view of a semiconductor component constructed in accordance with the invention.
FIG. 1B is an enlarged schematic side elevation view of the component.

All of the drawing Figures, particularly the cross sectional views, are schematic such that the elements contained therein are not to scale.

DETAILED DESCRIPTION OF THE PREFERRED EMBODIMENTS

As used herein, the term "semiconductor component" refers to an electronic element that includes a semiconductor die. Exemplary semiconductor components include semiconductor packages, semiconductor modules and BGA devices.

Figure 1C:
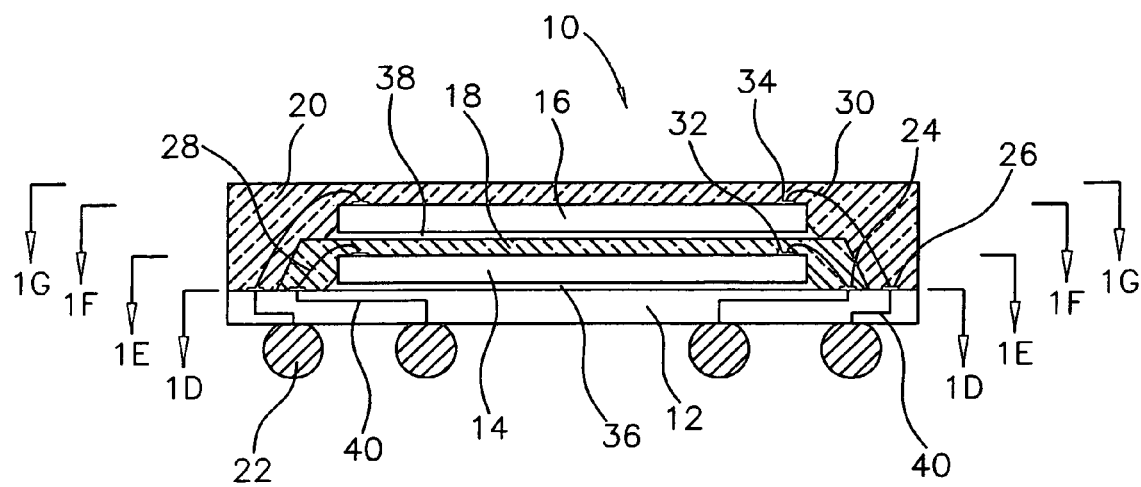
FIG. 1C is an enlarged schematic cross sectional view of the component taken along section line 1C-1C of FIG. 1A.

Referring to FIGS. 1A-1G, a semiconductor component 10 constructed in accordance with the invention is illustrated. In the illustrative embodiment, the component 10 is in the form of a chip scale package. As shown in FIG. 1C, the component 10 includes a substrate 12, a first die 14 bonded to the substrate 12, and a second die 16 stacked on the first die 14.

The first die 14 and the second die 16 comprise active semiconductor dice having a desired electrical configuration. Also in the illustrative embodiment, the first die 14 and the second die 16 have the same peripheral outlines, but can have different peripheral outlines. By way of example, each die 14, 16 can comprise a high speed digital logic device, such as a dynamic random access memory (DRAM), a static random access memory (SRAM), a flash memory, a microprocessor, a digital signal processor (DSP), or an application specific integrated circuit (ASIC). In addition, each die 14, 16 can have the same electronic configuration or a different electronic configuration. Further, the dice 14, 16 can be configured and interconnected, such that the component 10 forms a system in a package (SIP).

The component 10 also includes a first encapsulant 18 substantially encapsulating the first die 14, and a second encapsulant 20 substantially encapsulating the second die 16. The first encapsulant 18 and the second encapsulant 20 can comprise a curable polymer material such as an epoxy, a silicone, a polyimide or a transfer molded underfill compound (MUF). In addition, these polymer materials can include fillers such as silicates configured to reduce the coefficient of thermal expansion (CTE) and adjust the viscosity of the polymer material. The first encapsulant 18 and the second encapsulant 20 are preferably molded using a molding process to be hereinafter described.

As shown in FIG. 1C, the component 10 also includes a first adhesive layer 36 which attaches the first die 14 to the substrate 12, and a second adhesive layer 38 which attaches the second die 16 to the first encapsulant 18. The first adhesive layer 36 and the second adhesive layer 38 can comprise conventional die attach adhesives, such as a curable polymer such as epoxy, or a tape material such as a "KAPTON" tape, applied using techniques that are known in the art, such as deposition though a nozzle, or applying of cut decals. The first adhesive layer 36 and the second adhesive layer 38 can also comprise a molded material such as a molded underfill material.

The substrate 12 is configured as a support element for the dice 14, 16 and the encapsulants 18, 20. The substrate 12 is also configured as an interposer element, which includes a signal transmission system between the dice 14, 16 and the outside world. In the illustrative embodiment, the substrate 12 comprises a glass filled polymer, such as bismaleimide-triazine (BT), or another circuit board material. Alternately, the substrate 12 can comprise an electrically insulating plastic, ceramic or glass material.

Figures 1D, 1E:
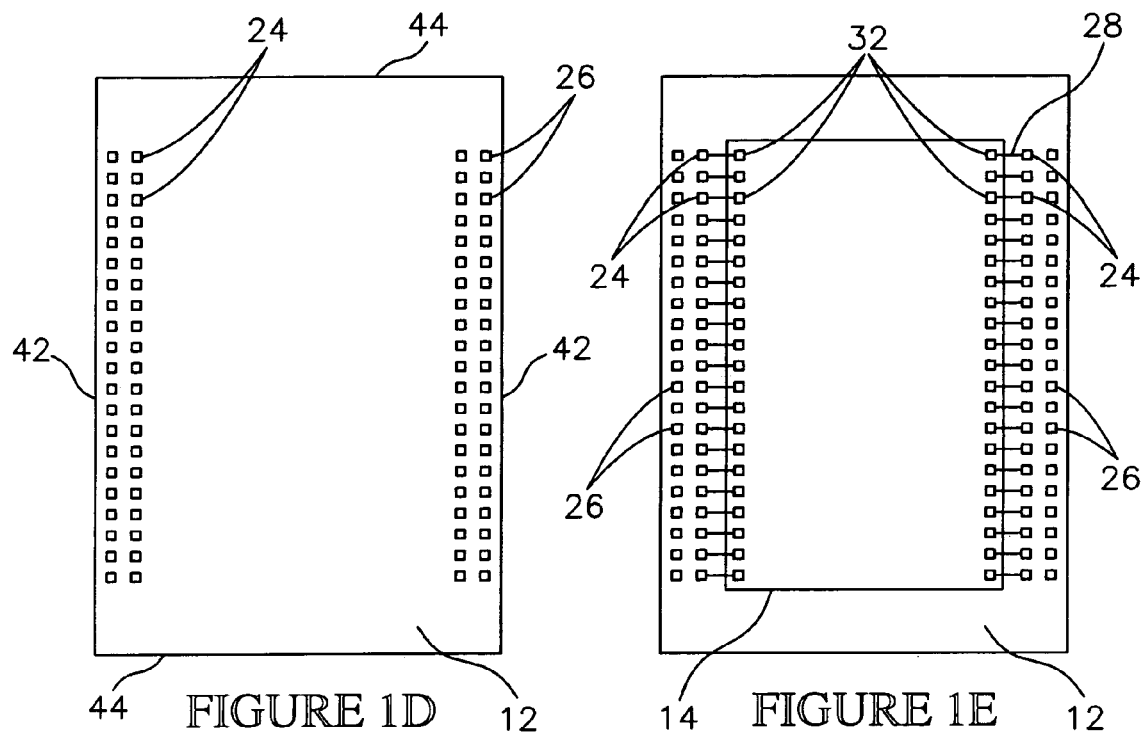
FIG. 1D is an enlarged schematic cross sectional view of the component taken along section line 1D-1D of FIG. 1C.
FIG. 1E is an enlarged schematic cross sectional view of the component taken along section line 1E-1E of FIG. 1C.

Also in the illustrative embodiment, the substrate 12 is generally rectangular shaped with opposing longitudinal edges 42 (FIG. 1D) and opposing lateral edges 44 (FIG. 1D). However, other polygonal shapes such as square, triangular, pentagonal or circular can also be employed. The peripheral outline (footprint) of the component 10 and the peripheral outline of the substrate 12 are substantially the same. As the substrate 12 has a peripheral outline that is slightly larger than, but about the same size as the peripheral outlines (footprints) of the dice 14, 16, the component 10 can be considered a chip scale package (CSP).

As shown in FIG. 1C, the substrate 12 includes an array of electrically conductive terminal contacts 22 configured for signal transmission to and from the component 10. In the illustrative embodiment, the terminal contacts 22 comprise metal bumps or balls. However, the terminal contacts 22 can also comprise pins, polymer bumps, spring contacts or any terminal contact known in the art. Also in the illustrative embodiment, there are forty four terminal contacts 22, arranged in a ball grid array (BGA) which includes four rows of eleven terminal contacts 22 each. However, this arrangement is merely exemplary, and the terminal contacts 22 can be arranged in any area array, such as a fine ball grid array (FBGA), an edge array, or a peripheral array, containing any desired number of terminal contacts 22.

Further, the terminal contacts 22 have outside diameters on the order of about 300 µm to 350 µm. This makes the terminal contacts 22 much larger in comparison to the other elements of the component 10. However, for illustrative purposes the terminal contacts 22 are shown as being about the same size as other elements of the component 10.

As shown in FIG. 1D, the substrate 12 also includes a pattern of first interconnect contacts 24 configured for wire bonding to the first die 14, and a pattern of second interconnect contacts 26 configured for wire bonding to the second die 16. In the illustrative embodiment, the second interconnect contacts 26 are arranged in two outside rows proximate to the opposing longitudinal edges 42 of the substrate 12. The first interconnect contacts 24 are also arranged in two rows, but inside of the second interconnect contacts 26 and closer to the inner portion of the substrate 12. The first interconnect contacts 24 and the second interconnect contacts 26 can comprise a wire bondable metal such as aluminum or copper and can have any desired shape, such as square, rectangular or circular.

As shown in FIG. 1C, the substrate 12 also includes conductors 40 which electrically connect the interconnect contacts 24, 26 to the terminal contacts 22 in a required circuit configuration. The conductors 40 can be formed using techniques that are known in the art such as forming conductive traces on outside surfaces of the substrate 12, or on inner levels of the substrate 12. In addition, the conductors 40 can include conductive vias which interconnect different surfaces or levels of the substrate 12.

As shown in FIG. 1E, the component 10 also includes first wire interconnects 28 wire bonded to the first interconnect contacts 24 on the substrate 12, and to first die contacts 32 on the first die 14. The first die contacts 32 can comprise bond pads, redistribution pads, or other wire bondable contacts in electrical communication with the integrated circuits contained on the first die 14.

Figures 1F, 1G:
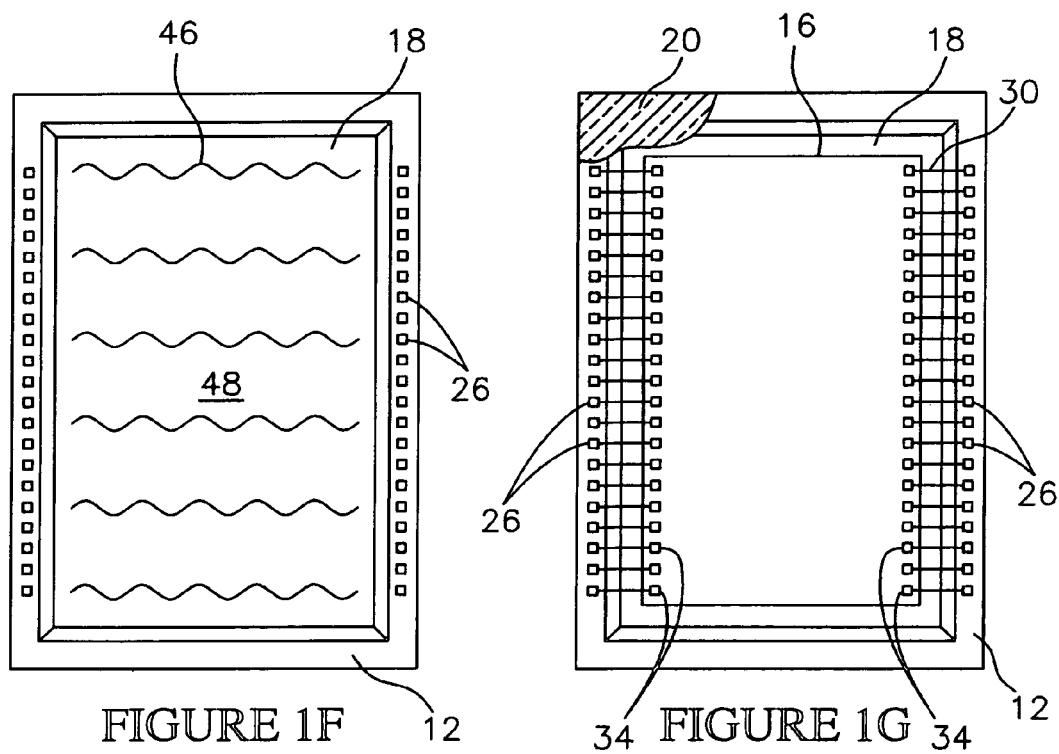
FIG. 1F is an enlarged schematic cross sectional view of the component taken along section line 1F-1F of FIG. 1C.
FIG. 1G is an enlarged schematic cross sectional view of the component taken along section line 1G-1G of FIG. 1C.

As shown in FIG. 1G, the component 10 also includes second wire interconnects 30 wire bonded to the second interconnect contacts 26 on the substrate 12, and to second die contacts 34 on the second die 16. The second die contacts 34 can comprise bond pads, redistribution pads, or other wire bondable contacts in electrical communication with the integrated circuits contained on the second die 16.

In the illustrative embodiment, both the first die contacts 32 (FIG. 1E) and the second die contacts 34 (FIG. 1G) are edge arrays, located along longitudinal edges of the dice 14, 16. Similarly, the interconnect contacts 24, 26 (FIG. 1D) on the substrate 12 are edge arrays located along longitudinal edges 42 (FIG. 1D) of the substrate 12. As is apparent, this arrangement is merely exemplary, and other area arrays or patterns, can be used for both the die contacts 32, 34 on the dice 14, 16, and the interconnect contacts 24, 26 on the substrate 12. However, with any arrangement, the second interconnect contacts 26 on the substrate 12 must be accessible for wire bonding, following formation of the first encapsulant 18 on the first die 14.

As shown in FIG. 1F, the first encapsulant 18 includes a planar surface 48 having a peripheral outline that is about the same size as, but is slightly larger than, the peripheral outline of the second die 16. In addition, the first encapsulant 18 has a peripheral outline that is larger than the first die 14, by an area sufficient to encapsulate the first die 14 and also to encapsulate the first wire interconnects 28. However, the first encapsulant 18 is inside the perimeter of the second interconnect contacts 26, and is shaped such that the second interconnect contacts 26 are not encapsulated by the first encapsulant 18.

Further, the first encapsulant 18 can include one or more locking features 46 formed on the planar surface 48 thereof. The locking features 46 are configured to promote adhesion of the second adhesive layer 38 to the first encapsulant 18, and to increase the adhesive bonding of the second die 16 to the first encapsulant 18. The locking features 46 can comprise molded features such as ridges, dimples, indentations, or grooves formed integrally with the first encapsulant 18. The locking features 46 can also comprise a layer of material such as an adhesion layer or a primer layer. As will be further explained, the first encapsulant 18 must be formed such that the second interconnect contacts 26 on the substrate 12 are not contaminated with encapsulating material, and remain accessible for wire bonding.

As shown in FIG. 1C, the second encapsulant 20 encapsulates the second die 16, encapsulates the first encapsulant 18, encapsulates the second wire interconnects 30, and encapsulates portions of the surface of the substrate 12. The second encapsulant 20 also forms the bulk of the outside of the component 10, and a protective body for the component 10. A peripheral outline of the second encapsulant 20 is large enough to encapsulate the second die and the second interconnect contacts 26. In addition, a peripheral outline of the second encapsulant 20 matches the peripheral outline of the substrate 12. Further, a thickness of the second encapsulant 20 is dependent on the height of the dice 14, 16 on the substrate 12, and the loop height of the second wire interconnects 30 on the substrate 12. The thickness of the second encapsulant 20 and the substrate 12 together determines the thickness (profile) of the component 10.

Figure 3A:
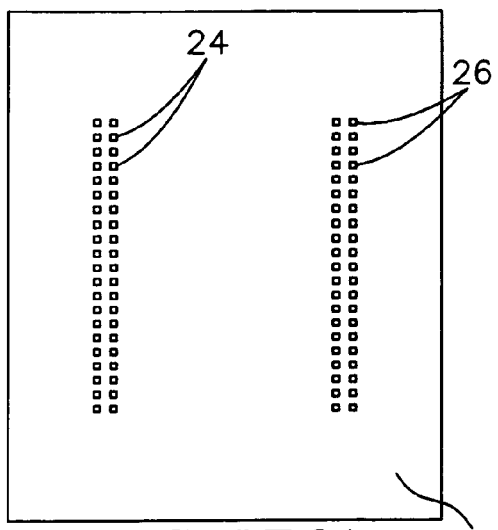
FIG. 3A is an enlarged schematic cross sectional view during the fabrication method, taken along section line 3A-3A of FIG. 2A.

Referring to FIGS. 2A-2F and 3A-3F, steps in a method for fabricating the component 10 are illustrated. Initially, as shown in FIGS. 2A and 3A, the substrate 12 can be provided. The substrate 12 preferably comprises a lead frame, a strip, a panel, or a wafer of material on which multiple components 10 can be formed, and then singulated into separate components 10. For example, the substrate 12 can be contained on an organic lead frame configured for use with conventional die attach equipment, molding equipment and wire bonding equipment used in semiconductor manufacture and packaging.

With an organic lead frame, the substrate 12 can comprise an organic polymer resin reinforced with glass fibers. Suitable materials include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. In addition, the substrate 12 can be constructed from a commercially produced bi-material core, such as a copper clad bismaleimide-triazine (BT) core.

The substrate 12 can be provided with the first interconnect contacts 24 and the second interconnect contacts 26 formed in a required configuration on an inner surface 50 thereof. In addition, the substrate 12 can be provided with the conductors 40 (FIG. 1C) in a required configuration, and with bonding sites (not shown) for the terminal contacts 22 on an outer surface 52 thereof in electrical communication with the interconnect contacts 26.

Figure 3B:
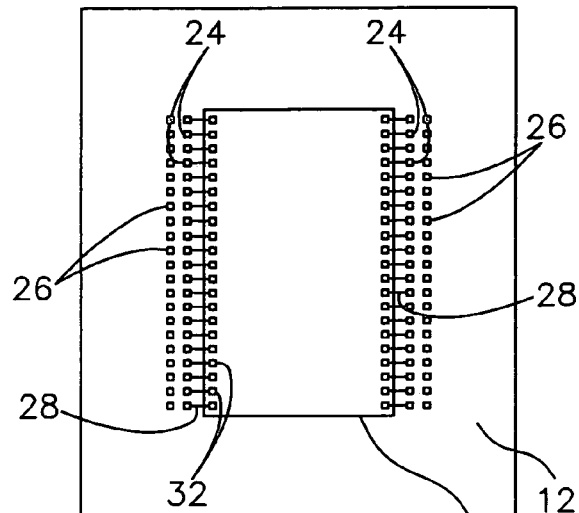
FIG. 3B is an enlarged schematic cross sectional view during the fabrication method, taken along section line 3B-3B of FIG. 2B.

As shown in FIGS. 2B and 3B, the first die 14 can be bonded to the substrate 12 by attaching the back side of the first die 14 to the adhesive layer 36, and by attaching the adhesive layer 36 to the inner surface 50 of the substrate 12. Conventional die attach equipment can be used to attach the adhesive layer 36 and to back bond the first die 14 to the substrate 12. In addition, the first die 14 can be wire bonded to the substrate 12 by bonding the first wire interconnects 28 to the first die contacts 32 on the first die 14, and to the first interconnect contacts 24 on the substrate 12. Conventional wire bonding equipment, such as a wire bonding tool, can be utilized to wire bond the first die 14 to the substrate 12.

As also shown in FIG. 2B, the terminal contacts 22 can be formed on the outer surface 52 of the substrate 12. However, the terminal contact forming step need not be performed at this point of the method, but can be delayed until just prior to the singulation step to follow. The terminal contacts 22 can be formed by reflow bonding pre-fabricated solder balls to bonding sites (not shown) on the outer surface 52 of the substrate in electrical communication with the interconnect contacts 24, 26.

The terminal contacts 22 can also be formed by electrolytic deposition or by electroless deposition of solder bumps to the bonding sites. A ball bumper such as one manufactured by Pac Tech Packaging Technologies of Falkensee, Germany can also be used to form the terminal contacts 22. The terminal contacts 22 can also be formed using a conventional wire bonder apparatus adapted to form a ball bond, and then to sever the attached wire. The terminal contacts 22 can also comprise conductive polymer bumps formed using a suitable deposition and curing process. As another alternative, the terminal contacts 22 can comprise pins or columns formed using a soldering, welding or brazing process.

Figure 3C:
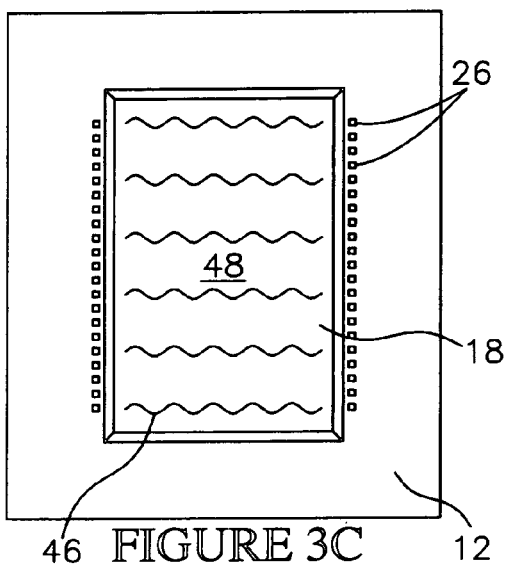
FIG. 3C is an enlarged schematic cross sectional view during the fabrication method, taken along section line 3C-3C of FIG. 2C.

Next, as shown in FIGS. 2C and 3C, the first encapsulant 18 can be formed on the substrate 12 to encapsulate the first die 14, the wire bonded first wire interconnects 28 and inner portions of the inner surface 50 of the substrate 12. A thickness of the first encapsulant 18 can be selected as required, with a minimum thickness being greater than the loop height of the first wire interconnects 28. In the illustrative embodiment the first encapsulant 18 is formed using a transfer molding process. In general, transfer molding is an automated form of compression molding in which a preform of a plastic material is forced from a pot into a heated mold cavity.

To perform the transfer molding process, a transfer molding apparatus 64 having a mold tooling fixture 54 with a mold cavity 58 and a direct gate 56 is provided. For simplicity the mold tooling fixture 54 is illustrated as being in contact with only the inner surface 50 of the substrate 12. However, in actual practice the mold tooling fixture 54 can includes a mating structure that contacts the outer surface 52 of the substrate 12.

The transfer molding apparatus 64 is configured to transfer a viscous plastic preform, such as a "NOVOLAC" based epoxy encapsulant, through the direct gate 56 and into the mold cavity 58. The direct gate 56 is configured to form the first encapsulant 18 without contaminating the second interconnect contacts 26 with the viscous encapsulant. The mold cavity 58 is configured to form the first encapsulant 18 with the planar surface 48 (FIG. 3C) for mounting the second die 16. The mold cavity 58 can also include structures, such as recesses or protrusions, configured to mold the locking features 46 (FIG. 3C) in the planar surface 48 (FIG. 3C) of the first encapsulant 18. Following transfer molding, the encapsulant can be cured and at least partially hardened, using techniques that are known in the art, such as oven curing.

Rather than transfer molding, the first encapsulant 18 can be formed by deposition of a viscous plastic using a conventional deposition apparatus, such as a material dispensing system having a computer controlled nozzle. One suitable system is manufactured by Asymtek of Carlsbad, Calif.

The first encapsulant 18 can also be formed using an injection molding process. With injection molding, a liquefied plastic is injected into a mold cavity in a manner similar to the above described transfer molding process.

The first encapsulant 18 can also comprise a laser imageable material patterned using a stereo lithography, or laser imaging process. In this case, the first encapsulant 18 can comprise a laser imageable material, such as a Cibatool SL 5530 resin manufactured by Ciba Specialty Chemicals Corporation. A stereo lithography system for performing the process is available from 3D Systems, Inc. of Valencia, Calif.

Figure 3D:
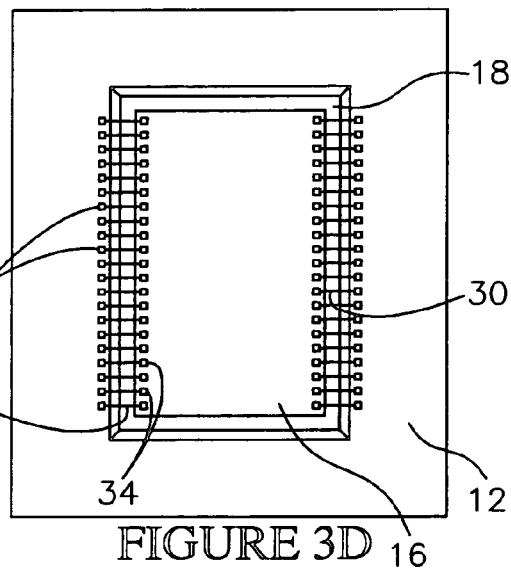
FIG. 3D is an enlarged schematic cross sectional view during the fabrication method, taken along section line 3D-3D of FIG. 2D.

Next, as shown in FIGS. 2D and 3D, the second die 16 can be bonded to the planar surface 48 (FIG. 3C) of the first encapsulant 18. The second die 16 can be bonded to the first encapsulant 18 by attaching the back side of the second die 16 to the adhesive layer 38, and by attaching the adhesive layer 38 to the planar surface 48 (FIG. 3C) of the first encapsulant 18. Conventional die attach equipment can be used to attach the adhesive layer 38 and to back bond the second die 16 to the first encapsulant 18.

As also shown in FIGS. 2D and 3D, the second die 16 can be wire bonded to the substrate 12 by bonding the second wire interconnects 30 to the second die contacts 34 on the second die 16, and to the second interconnect contacts 26 on the substrate 12. Conventional wire bonding equipment, such as a wire bonding tool, can be utilized to wire bond the second die 16 to the substrate 12. In addition, the first encapsulant 18 must be dimensioned to allow access to the second interconnect contacts 26 by the wire bonding tool.

Figure 3E:
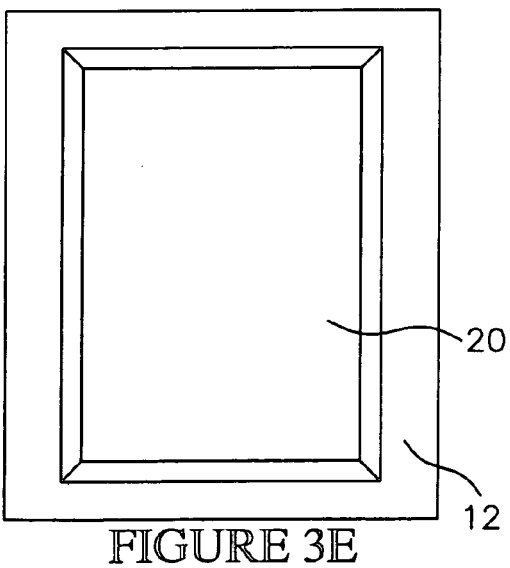
FIG. 3E is an enlarged schematic cross sectional view during the fabrication method, taken along section line 3E-3E of FIG. 2E.

Next, as shown in FIGS. 2E and 3E, the second encapsulant 20 can be formed to encapsulate the second die 16, the wire bonded second wire interconnects 30, and outer portions of the inner surface 50 of the substrate 12. A thickness of the second encapsulant 20 can be selected as required, with a minimum thickness being greater than the loop height of the wires 30. The second encapsulant 20 can be formed using a transfer molding process substantially as previously described for the first encapsulant 18. Alternately, the second encapsulant can be formed by viscous deposition, by injection molding, or by stereo lithography, substantially as previously described for the first encapsulant 18.

Figure 3F:
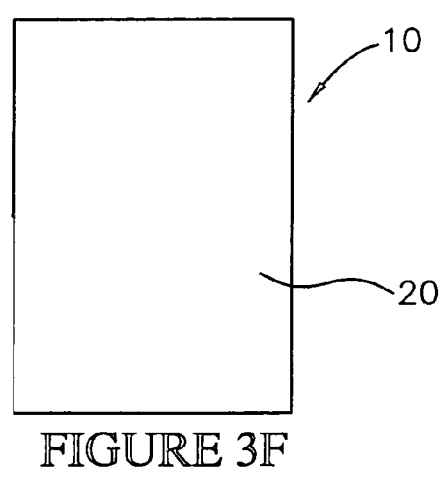
FIG. 3F is an enlarged schematic cross sectional view during the fabrication method, taken along section line 3F-3F of FIG. 2F.

Next, as shown in FIGS. 2F and 3F, a singulating step can be performed to singulate the component 10 from the lead frame. The singulating step can be performed using techniques that are known in the art such as sawing, shearing or punching.

Figure 4:
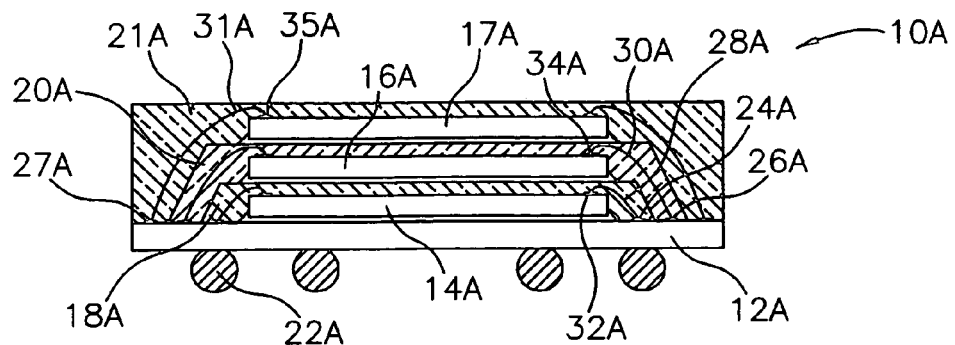
FIG. 4 is an enlarged schematic cross sectional view equivalent to FIG. 1C of an alternate embodiment component.

Referring to FIG. 4, an alternate embodiment three dice component 10A is constructed substantially as previously described for component 10 (FIG. 1C) but includes three dice in a single stack. The component 10A includes a substrate 12A having terminal contacts 22A, and a first die 14A back bonded and wire bonded to the substrate 12A. In addition, a plurality of first wire interconnects 28A are wire bonded to first interconnect contacts 24A on the substrate 12A, and to corresponding first die contacts 32A on the first die 14A. Further, a first encapsulant 18A encapsulates the first die 14A and the first wire interconnects 28A.

The component 10A also includes a second die 16A back bonded to the first encapsulant 18A and wire bonded to the substrate 12A, substantially as previously described for the second die 16 (FIG. 1C). In addition, a plurality of second wire interconnects 30A are wire bonded to second interconnect contacts 26A on the substrate 12A, and to corresponding second die contacts 34A on the second die 16A. Further, a second encapsulant 20A encapsulates the second die 16A, the second wire interconnects 30A and the first encapsulant 18A.

The component 10A also includes a third die 17A back bonded to the second encapsulant 20A and wire bonded to the substrate 12A, substantially as previously described for the second die 16 (FIG. 1C). In addition, a plurality of third wire interconnects 31A are wire bonded to third interconnect contacts 27A on the substrate 12A, and to corresponding third die contacts 35A on the third die 17A. Further, a third encapsulant 21A encapsulates the third die 17A, the third wire interconnects 31A and the second encapsulant 21A. Alternately, the component 10A can be constructed with a stack of any desired number of dice (e.g., four, five, six), and can be configured as a system in a package (SIP).

Figure 5:
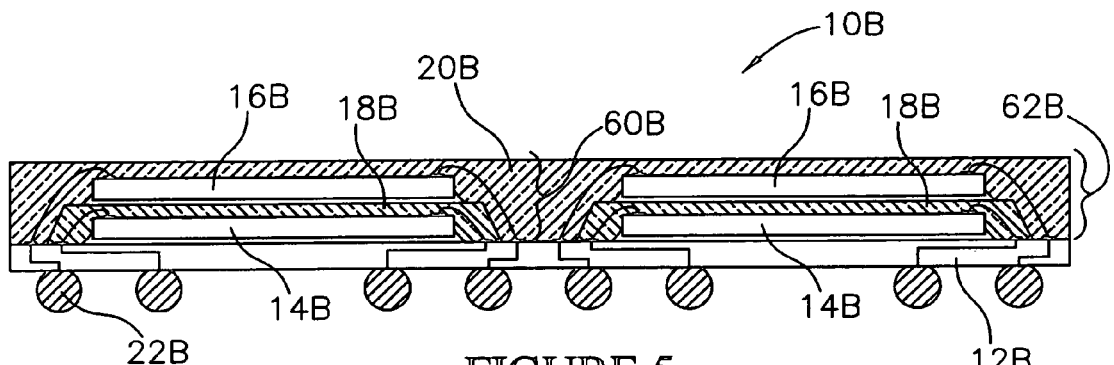
FIG. 5 is an enlarged schematic cross sectional view equivalent to FIG. 1C of an alternate embodiment component.

Referring to FIG. 5, an alternate embodiment four dice component 10B is constructed substantially as previously described for component 10 (FIG. 1C), but includes four dice in two stacks 60B, 62B of two dice each. The component 10B includes a substrate 12B having terminal contacts 22B, substantially as previously described for substrate 12 (FIG. 1C) and terminal contacts 22 (FIG. 1C).

The component 10B also includes a first die stack 60B and a second die stack 62B. The first die stack 60B includes a first die 14B back bonded and wire bonded to the substrate 12B, and a first encapsulant 18B encapsulating the first die 14B. The second die stack 62B includes a first die 14B back bonded and wire bonded to the substrate 12B, and a first encapsulant 18B encapsulating the first die 14B. Both the first die stack 60B, and the second die stack 62B include a second die 16B back bonded to the first encapsulant 18B, and wire bonded to the substrate 12B. The component 10B also includes a second encapsulant 20B which encapsulates both die stacks 60A, 60B. The component 10B can include any number of die stacks, and can be configured as a multi chip module.

Figure 6:
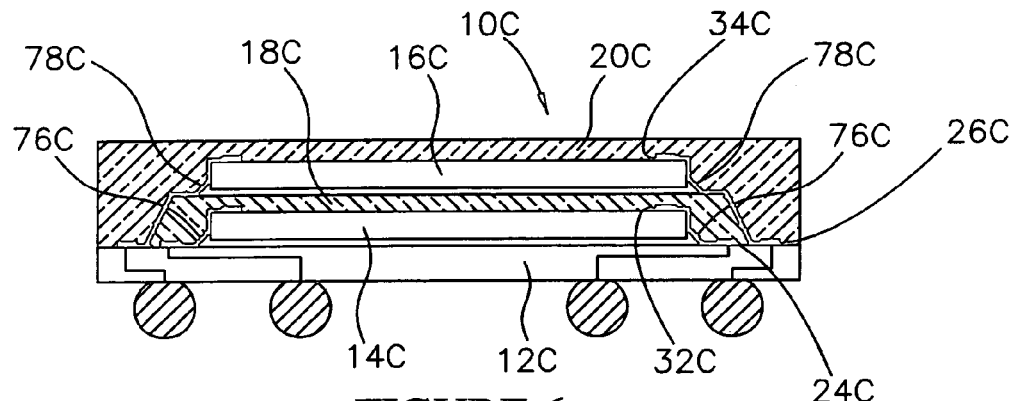
FIG. 6 is an enlarged schematic cross sectional view equivalent to FIG. 1C of an alternate embodiment component.

Referring to FIG. 6, an alternate embodiment component 10C includes a substrate 12C, a first die 14C back bonded to the substrate 12C, and a first encapsulant 18C encapsulating the first die 14C. The component 10C also includes a second die 16C back bonded to the first encapsulant 18C, and a second encapsulant 20C encapsulating the second die 16C and the first encapsulant 18C. In addition, the component 10C includes tape interconnects 76C bonded to first die contacts 32C on the first die 14C, and to first interconnect contacts 24C on the substrate 12C. Further, the component 10C includes tape interconnects 78C bonded to second die contacts 34C on the second die 16C and to second interconnect contacts 26C on the substrate 12C. The tape interconnects 76C, 78C can comprise a TAB tape, such as ASMAT manufactured by Nitto Denko of Japan. In addition, the tape interconnects 76C, 78C can be bonded to the dice 14C, 16C and the substrate 12C using conventional TAB (tape automated bonding) techniques, such as thermode bonding. As with the wire interconnects 28, 30 (FIG. 1C), the tape interconnects 76C are encapsulated in the first encapsulant 18C, and the tape interconnects 78C are encapsulated in the second encapsulant 20C.

Figure 7:
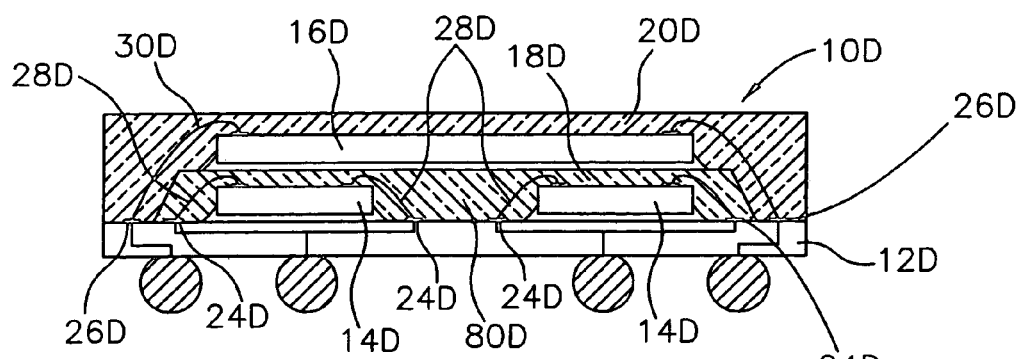
FIG. 7 is an enlarged schematic cross sectional view equivalent to FIG. 1C of an alternate embodiment component.

Referring to FIG. 7, an alternate embodiment component 10D is illustrated. The component 10D includes three dice in two stacks, but with one of the stacks having a pair of dice. More particularly, the component 10D includes a substrate 12D, a pair of first dice 14D back bonded and wire bonded to the substrate 12D, and a first encapsulant 18D encapsulating the pair of first dice 14D. The component 10D also includes first wire interconnects 28D wire bonded to the pair of first dice 14D, and to first interconnect contacts 24D on the substrate 12D. The first wire interconnects 28D are encapsulated by the first encapsulant 18D. The first dice 14D have substantially matching peripheral outlines and have a space 80D therebetween for some of the wire interconnects 28D, which is filled by the first encapsulant 18D. The component 10D also includes a second die 16D back bonded to the first encapsulant 18D and wire bonded to the substrate 12D, and a second encapsulant 20D encapsulating the second die 16D and the first encapsulant 18D. The second die 16D has a peripheral outline which is larger than the combined peripheral outlines of the pair of first dice 14D and the space therebetween. The component 10D also includes second wire interconnects 30D wire bonded to the second die 16D and to second interconnect contacts 26D on the substrate 12D. The second wire interconnects 30D are encapsulated in the second encapsulant 20D.

Figure 8:
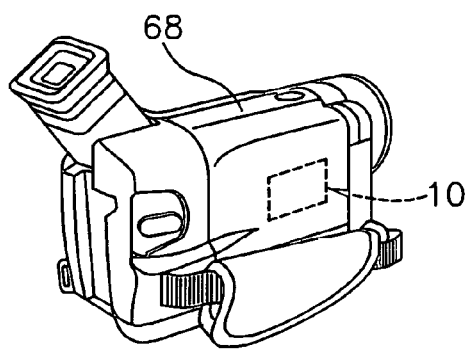
FIG. 8 is a schematic cross sectional view of a camcorder system incorporating components constructed in accordance with the invention.

Referring to FIG. 8, a digital camcorder system 68 includes one or more components 10, which can be mounted in a suitable manner, and configured to perform a desired circuit function in the camcorder system 68.

Figure 9:
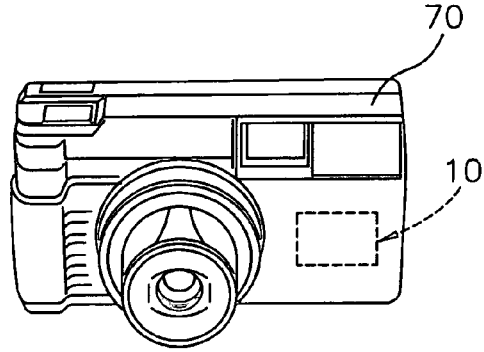
FIG. 9 is a schematic cross sectional view of a camera system incorporating components constructed in accordance with the invention.

Referring to FIG. 9, a camera system 70 includes one or more components 10, which can be mounted in a suitable manner, and configured to perform a desired circuit function in the camera system 70.

Figure 10:
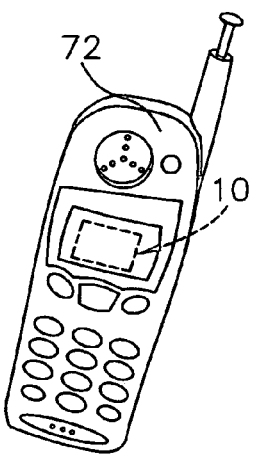
FIG. 10 is a schematic cross sectional view of a cellular phone system incorporating components constructed in accordance with the invention.

Referring to FIG. 10, a cellular phone system 72 includes one or more components 10, which can be mounted in a suitable manner, and configured to perform a desired circuit function in the cellular phone system 72.

Figure 11:
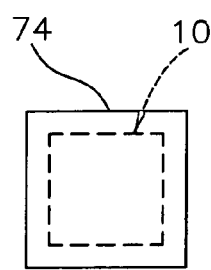
FIG. 11 is a schematic cross sectional view of a medical device system incorporating components constructed in accordance with the invention.

Referring to FIG. 11, a medical device system 74 includes one or more components 10, which can be mounted in a suitable manner, and configured to perform a desired circuit function in the medical device system 74.

Figure 12:
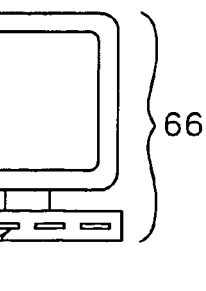
FIG. 12 is a schematic cross sectional view of a computer system incorporating components constructed in accordance with the invention.

Referring to FIG. 12, a computer system 66 includes one or more components 10, which can be mounted to the computer system 66 in a suitable manner. In addition, the components 10 can be configured to perform a desired function in the computer system 66 such as memory, storage or micro processing.

Thus the invention provides an improved semiconductor component having stacked, encapsulated dice, a method for fabricating the component, and systems incorporating the component. While the invention has been described with reference to certain preferred embodiments, as will be apparent to those skilled in the art, certain changes and modifications can be made without departing from the scope of the invention as defined by the following claims.

What is claimed is:

1. A semiconductor component comprising:
   a substrate comprising a plurality of interconnect contacts and a plurality of terminal contacts in electrical communication with the interconnect contacts;
   a first die back bonded to the substrate, electrically connected to the interconnect contacts;
   a plurality of first interconnects bonded to the first die and the interconnect contacts;
   a first encapsulant encapsulating the first die and the first interconnects;
   a second die back bonded to the first encapsulant, electrically connected to the interconnect contacts;
   a plurality of second interconnects bonded to the second die and the interconnect contacts;
   a second encapsulant encapsulating the second die, the first interconnects, and the first encapsulant;
   a third die back bonded to the second encapsulant, electrically connected to the interconnect contacts;
   a plurality of third interconnects bonded to the third die and the interconnect contacts; and
   a third encapsulant encapsulating the third die, the third interconnects and the second encapsulant.

2. The semiconductor component of claim 1 wherein the first encapsulant comprises at least one locking feature configured to increase adhesive bonding of the second die to the first encapsulant.

3. The semiconductor component of claim 1 wherein the terminal contacts comprise a ball grid array, and the substrate and the third encapsulant have a chip scale outline.

4. The semiconductor component of claim 3 wherein the first interconnects, the second interconnects and the third interconnects comprise wire bonded wires.

5. The semiconductor component of claim 3 wherein the first interconnects, the second interconnects and the third interconnects comprise TAB bonded tape.

6. A semiconductor component comprising:
a substrate comprising a plurality of interconnect contacts and a plurality of terminal contacts in electrical communication with the interconnect contacts;
a first die back bonded to the substrate, electrically connected to the interconnect contacts;
a first encapsulant on the substrate encapsulating the first die and having at least one locking feature on a surface thereof;
a plurality of first interconnects bonded to the first die and the interconnect contacts and encapsulated in the first encapsulant;
a second die back bonded to the first encapsulant, electrically connected to the interconnect contacts and encapsulated in a second encapsulant, the locking feature configured to increase adhesive bonding of the second die to the first encapsulant;
a plurality of second interconnects bonded to the second die and the interconnect contacts and encapsulated in the second encapsulant;
a third die back bonded to the second encapsulant, electrically connected to the interconnect contacts; and
a third encapsulant encapsulating the third die and the second encapsulant.

7. The component of claim 6 wherein the second encapsulant includes at least one second locking feature configured to increase adhesive bonding of the third die to the second encapsulant.

8. The component of claim 6 wherein the locking feature comprises a molded feature in the first encapsulant.

9. The component of claim 6 wherein the locking feature comprises a layer of material.

* * * * *